Figure 1:
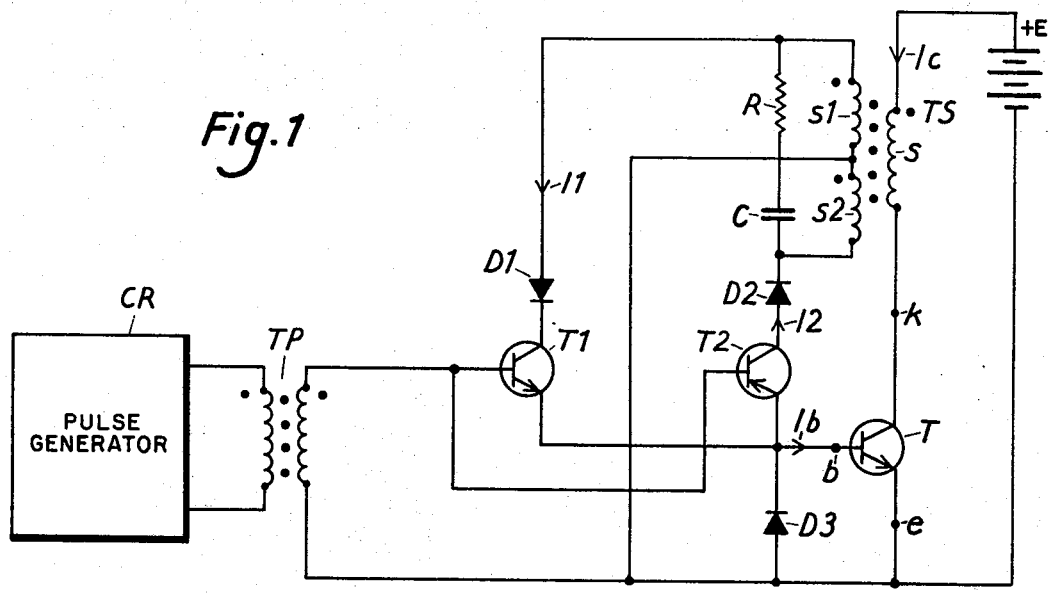

United States Patent [19]

Ekelund

[11] 3,999,086
[45] Dec. 21, 1976

[54] DRIVE CIRCUIT FOR A CONTROLLABLE ELECTRONIC SWITCHING ELEMENT, FOR EXAMPLE, A POWER TRANSISTOR

[75] Inventor: Folke Josef Bertil Ekelund, Norsborg, Sweden

[73] Assignee: Telefonaktiebolaget L M Ericsson

[22] Filed: Sept. 12, 1974

[21] Appl. No.: 505,205

[30] Foreign Application Priority Data
Sept. 21, 1973 Sweden .......................... 73128928

[52] U.S. Cl. .............................. 307/270; 307/300; 307/314; 307/254
[51] Int. Cl.² ........................................ H03K 17/00
[58] Field of Search .......... 307/253, 254, 270, 300, 307/314

[56] References Cited
UNITED STATES PATENTS

| | | | |
|---|---|---|---|
| 2,915,649 | 12/1959 | Cagle | 307/300 |
| 3,043,965 | 7/1962 | Scarbough et al. | 307/282 |
| 3,217,173 | 11/1965 | Strohmeier | 307/282 |
| 3,470,391 | 9/1969 | Granger | 307/300 |
| 3,757,144 | 9/1973 | Hetterscheid et al. | 307/300 |
| 3,872,327 | 3/1975 | Rudert et al. | 307/300 |

Primary Examiner—Stanley D. Miller, Jr.
Assistant Examiner—B. P. Davis
Attorney, Agent, or Firm—Hane, Baxley & Spiecens

[57] ABSTRACT

A drive circuit for a controllable electronic switching element, preferably a power transistor has two part circuits. One part circuit includes a first transistor and one primary half of a current transformer the secondary winding of which is connected to the main current path of the switching element. The other part circuit consists of a second transistor and the other primary half of the current transformer. The transistor in each part circuit has its collector connected to the respective primary half and the bases of the transistors are connected together and to a voltage pulse source. The emitter of each of the transistors is connected to the control electrode of the switching element so that one of the part circuits forms a positive feedback loop for the collector current of the switching element when it is conducting and the other of the part circuits forms a negative feedback loop when the switching element is not non-conducting.

5 Claims, 2 Drawing Figures

DRIVE CIRCUIT FOR A CONTROLLABLE ELECTRONIC SWITCHING ELEMENT, FOR EXAMPLE, A POWER TRANSISTOR

The present invention relates to a drive circuit for a controllable electronic switching which can be controlled to its conducting and non-conducting state by means of a current- or a voltage pulse fed to its control electrode. The purpose of the drive circuit is to bring rapidly the switching element either to its completely conducting or to its non-conducting state and to maintain the element in the state thus assumed. The idea of the invention is applied to switching elements as, for example, power trasistors included in DC-DC converters, inverters, chopper circuits and the like in which there are great requirements for the reliability of the switching process of the element for varying loads and for varying design of the rest of the circuits.

When using power transistors as electronic switching elements, a number of problems arise in the construction of circuits which should meet the above mentioned requirements, specially in those cases when relatively high currents and/or voltages are to be switched. One problem is to bring the transistor from its non-conducting to its conducting state with the least possible power loss (switching loss), even in the case when its collector current rapidly increases and reaches a maximum value after having been turned on which value is considerably higher than the mean value during the time when the transistor is conducting. Another problem is to achieve that the transistor in one of its states should be completely conducting independent of the magnitude of the current which flows through its main current circuit. This in the practice means that the voltage drop across the collector-emitter of the transistor in the conducting state should be as low as possible and independent of the collector current. A further problem is to reduce the transition time of the transistor, i.e. the time interval within which the control pulse has ceased and the collector current has decreased to 90% of the initial value, to a minimal value. Finally, it is a problem to bring the transistor from its conducting to its non-conducting state without the appearance of a so-called secondary breakdown, i.e. without the appearance of any dangerous current displacement for the transistor, which can be avoided on the one hand by achieving a sufficiently rapid switch-over process and on the other hand by insuring that the control voltage pulse which is fed to the transistor is made as small as possible so that the electrical field which influences the current distribution in the transistor during the switching off process cannot reach such a dangerous current displacement. At high power levels, i.e. at high currents through the semiconductor layer of the transistor, this problem can become considerable. It is previously known, in order to avoid such a secondary breakdown when switching to the conducting state, to supply to the base of the transistor a voltage pulse of relatively high value, whereby a sufficiently high current through the base-emitter layer of the transistor is produced. However, this implies that the corresponding high current through the layer is necessary, in order to drive the transisitor to its non-conducting state consequently the control is by means of a relatively high voltage pulse, whereby undesired voltage peaks can appear across its base-emitter junction.

A further problem to solve is to dimension the control current which drives the transistor to its states in accordance with the actual load in the switching instants, so that no unnecessary high current is fed to its base. Such a dimension is desirable due to the fact that the after-conduction of the transistor when switching from its conducting to its non-conducting state is dependent on the value of the control current, i.e. The higher the control current the longer the after conduction. Thus, one should dimension the control current to that a value which is required for the actual load.

Previously known circuits for controlling an electronic switching element like a power transistor are generally so constructed that a control voltage source feeds the primary winding of a pulse transformer, the secondary winding of which, via a RC-circuit, delivers a control voltage pulse to the base-emitter circuit of the transistor. The RC-circuit is used to compensate the inductance in the circuit in order to accomplish a rapid switching process. Such a previously known control circuit is in general dimensioned to deliver a maximum current pulse to the base of the transistor, i.e. a current pulse the value of which is adapted to the maximum load current flowing through the main circuit of the transistor. This is so that on the one hand one avoids the above mentioned risks for secondary breakdown and on the other hand achieves a rapid switching of the transistor and finally safely maintaining the transistor fully conducting during the whole conduction time independent of the wave form of the collector current. However, there is a drawback, due to the current amplification factor of the transistor, that the base current becomes relatively high, especially if the collector current shows considerable peaks causing high power losses in the control current circuit. In addition, at lower values of the main current through the transistor, an unnecessary high charge distribution in the base layer and a high control voltage drop across the base-emitter of the transistor is obtained when the control circuit is dimensioned for maximum load current.

An object of the present invention is to provide a drive circuit for a controllable electronic switching element by means of which rapid and reliable switching element and least possible delay between the flank of the control pulse and the switching instant can be obtained.

Another object of the present invention is to provide a drive circuit for a controllable electronic switching element which circuit delivers a control current pulse in order to cause the switching element to switch and in which the magnitude of the required current pulse both at turn-on and at turn-off of the element is dependent on the magnitude of the main current flowing through the switching element.

Figure 2:
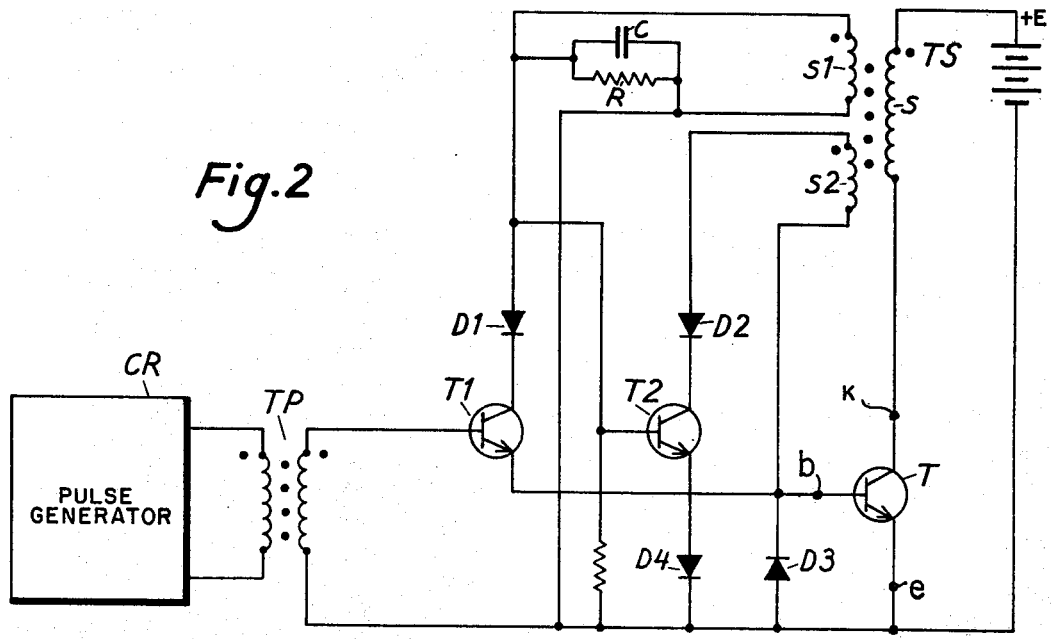

The invention, the characteristics of which appear from the appended claims, will be more fully described with reference to the accompanying drawing in which FIG. 1 shows one embodiment of the drive circuit according to the invention, and FIG. 2 shows another embodiment of the drive circuit according to the invention.

In FIG. 1, a power transistor is designated by T which in the present case is of NPN-type having a collector electrode $k$, an emitter electrode $e$ and a base electrode $b$. To the base electrode $b$ the emitters of two transistors T1 and T2 are connected, the transistors being of opposite conduction type. The bases of the transistors T1, T2 are connected together and connected to the secondary winding of the pulse transformer TP whose primary winding is connected to a pulse generating circuit CR for producing positive and negative pulses which control the transistor T1 to its conducting and non-conducting state and the transistor T2 to its non-conducting and conducting state, respectively. Such a pulse producing circuit is generally known to those skilled in the art. Since it forms no part of the invention it has been represented by only a block in the FIGS. 1 and 2 and will not further be described. The collector of the transistor T1 is, via the diode D1, connected to one winding half s1 of a current transformer TS and to a resistor-capacitor combination RC. The collector of the transistor T2 is connected to the other winding half $s2$ of the current transformer TS and to the resistor-capacitor combination RC. In the collector circuit of the power transistor T the primary winding $s$ of the current transformer is connected in order to transform the value of the collector current to one of the two winding halves s1 and s2. It should be noted that two part circuits have been formed of which one contains the winding half $s1$ and the transistor T1 and the other contains the winding half $s2$ and the transistor T2. One of the part circuits forms a positive feedback loop for the collector current of the power transistor when this is to be switched from its non-conducting to its conducting state and the other part circuit forms a negative feedback loop when the transistor is to be switched from its conducting to its non-conducting state. Across the primary winding of transformer TS and the collector-emitter circuit of the power transistor T is a source of operating voltage +E which generates the current IC.

When the power transistor T is to be brought to its conducting from its non-conducting state, a positive pulse is delivered from the control circuit CR via the pulse transformer TP which pulse appears on the base of the transistor T1 and T2, the transistor T1 being conducting and the transistor T2 being non-conducting. Herewith a current circuit is opened which includes the winding half $s1$, the diode D1, the conducting transistor T1 and the base-emitter circuit $b-e$ of the power transistor T. The control current pulse from the control circuit CR then passes the base-emitter junction of the power transistor T and injects into this an initial charge, so that collector current begins to arise. As a consequence a cumulative process is initiated in that that the current through the collector circuit is transformed by means of the current transformer TS to the current conducting circuit containing the transistor T1. The control current pulse from the control circuit CR and the collector current transformed via transformer Ts have been dimensioned so that for each instant more charge is injected into the base of the transistor T than that which is required in order to maintain the instantaneous value of the collector current. This dimensioning can be accomplished by chosing a suitable value on the ratio $n$ of the current transformer (the ratio between the turn of the windings $s$ and $s1$, $s2$ respectively), for example, by chosing $n \geq h\text{FE}$, where $h\text{FE}$ is the current amplification factor of the power transistor. If the collector current and the base current of the transistor T are designated by $Ic$ and $Ib$, respectively and the current amplification factor of the transistor is $h\text{FE}$, then $Ib > Ic \cdot 1/h\text{FE}$, for which reason the current $I1$ and $Ic$ rapidly increase until the power transistor T is fully conducting. The transistor T after that remains in its conducting state because a base current of sufficiently high value and proportional to the collector current $Ic$ is produced by the transformer winding s1.

When the transistor T is to be switched from its conducting to its non-conducting state, a negative pulse from the control circuit CR is delivered via the transformer TP to the base of each of the transistors T1 and T2. Herewith the transistor T1 is non-conducting and the transistor T2 conducting. Thus a current conducting circuit is formed by the transistor T2, the winding half $s2$ and the base-emitter circuit $b-e$ of the power transistor T. The transistor T1 becomes non-conducting and the current through it will cease and the collector current to the power transistor T will be transformed to the winding half $s2$. Through the transistor T2, the winding half $s2$ and the base-emitter circuit of the power transistor a current is driven having a direction which is opposite the direction of the current which brought the power transistor to its conducting state. Thus the charge carriers in the base-emitter layer of the transistor will be driven out by this oppositely directed current, and a rapid transfer from the conducting to the non-conducting state is accomplished.

The currents which each in the both cases flows through one half $s1$ and the other half $s2$, respectively is relatively the collector current of the same direction, for which reason any remagnetization of the current transformer does not take place. Such a remagnetization would counteract the current switching between the winding halves $s1$ and $s2$, i.e. would prevent a rapid switching process. By impressing on the base-emitter layer of the power transistor a current which is practically equal and oppositely directed to the current which brought the transistor fully conducting immediately before the beginning of the switching off process, a more rapid switching will be obtained than if a break in the base current had taken place. The current which brings the transistor into its non-conducting state is always controlled by the collector current, i.e. optimally great current is utilized in order to make the power transistor non-conducting and the time of the switching process will be practically the same for different values of the collector current Ic. Consequently a current is fed to the base of the power transistor which controls the state of the transistor, its base-emitter voltage always assumes a suitable value and no overvoltages appear.

The series connection of the resistor R and the capacitor C connected across the winding halves s1 and $s2$ has the purpose of limiting the voltage pulse which is produced by the current transformer TS at the remagnetization of the same which occurs after that the turnoff process is accomplished. The diodes D1 and D2 connected to the collectors of the transistors T1 and T2, respectively serve to prevent current to flow through the secondary winding of the pulse transformer TP, through the respective transistor and through the winding halves $s1$ and $s2$, respectively, during the remagnetization of the current transformer TS. The diode D3 is connected to the emitter of the transistor T2 in order to limit the negative value of the base-emitter voltage when the power transistor is in its non-conducting state.

In the embodiment according to FIG. 2, a variant of the drive circuit is shown in which the transistors T1 and T2 have been connected in somewhat different manner. In this embodiment, instead, the base of the transistor T2 has been connected to the collector of the transistor T1. When the transistor T1 has been brought to its conducting state by means of a positive voltage pulse from the control circuit CR, the transistor T2 is non-conducting so that all the current flows through the transistor T1 and to the base-emitter circuit b–e of the power transistor T. When a negative pulse appears on the base of the transistor T1, this is brought to its non-conducting state and current flows instead to the base of the transistor T2 which becomes conducting. Thus an oppositely directed current flows to the base-emitter circuit b–e of the power transistor across the connection point between the winding half s2 and the base electrode b. For the remainder the same function as in the circuit according to FIG. 1 is obtained.

The transistors T1 and T2 according to FIG. 1 and 2 can principally be substituted by other controllable switching elements, for example tryristors. Therewith it is suitable to divide the secondary winding of the pulse transformer TP in two winding halves, the midpoint of which is connected to the point to which the emitter of the power transistor is connected. The two endpoints of the winding halves of the pulse transformer are then connected to each control electrode of the thyristors. This embodiment is preferable in the case when very high base currents (several amperes) to the power transistor are to be produced.

We claim:

1. A drive circuit for a controllable electronic switch element including a main current circuit and a control current circuit whereby the flow of control current in said control current circuit controls said controllable electronic switch element to govern the flow of current in said main current circuit, said drive circuit comprising a first current circuit, a second current circuit, magnetic feedback means coupling said main current circuit to said first and second current circuits for providing feedback signals from said main current circuit to said first or second current circuits, pulse generating means for generating control pulses of first and second polarities, said first current circuit including a first controllable switching element means connected to said pulse generating means and responsive to control pulses of said first polarity for initiating the flow of a first control current to said control current circuit to render said controllable electronic switch element conducting, and said second current including a second controllable switching element means connected to said pulse generating means and responsive to control pulses of said second polarity for initiating the flow of a second control current from said control current circuit to render said controllable electronic switch element non-conducting.

2. A drive circuit according to claim 1, wherein said magnetic feedback means comprises a transformer, the primary winding of which is connected in series with said main current circuit and two secondary winding halves of which one is included in the first current circuit and connected in series with said first controllable switching element means and the second is included in the second current circuit and connected in series with the second controllable switching element means, the turns ratio between the primary and each of the respective secondary winding halves being chosen in dependence on the current amplification factor of the electronic switching element.

3. A drive circuit according to claim 1 wherein each of said controllable switching element means includes a transistor having control, output and reference electrodes.

4. A drive circuit according to claim 3 wherein the control electrodes of each of said transistors are connected together and to said pulse generating means.

5. A drive circuit according to claim 3 wherein the control electrode of the transistor of said first controllable switching element means is connected to said pulse generating means and the control electrode of the transistor of said second controllable switching element means is connected to the output electrode of the transistor of said first controllable switching element means.

* * * * *